United States Patent
Lin

(10) Patent No.: US 7,188,663 B2
(45) Date of Patent: Mar. 13, 2007

(54) RADIATING MODULE AND THE MANUFACTURING METHOD THEREOF

(75) Inventor: Hsin-Cheng Lin, Taipei County (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 315 days.

(21) Appl. No.: 10/786,034

(22) Filed: Feb. 26, 2004

(65) Prior Publication Data

US 2005/0126762 A1 Jun. 16, 2005

(30) Foreign Application Priority Data

Dec. 16, 2003 (TW) .............................. 92135628 A

(51) Int. Cl.
*H05K 7/20* (2006.01)
(52) U.S. Cl. .................. 165/104.33; 361/700
(58) Field of Classification Search ........... 165/104.33; 361/700
See application file for complete search history.

(56) References Cited

U.S. PATENT DOCUMENTS

| | | | | |
|---|---|---|---|---|
| 6,745,824 B2 * | 6/2004 | Lee et al. .............. | 165/104.14 |
| 6,830,098 B1 * | 12/2004 | Todd et al. ............. | 165/104.33 |
| 6,918,429 B2 * | 7/2005 | Lin et al. ................. | 165/80.3 |
| 7,021,368 B2 * | 4/2006 | Lin et al. ............... | 165/104.33 |
| 2002/0139833 A1 * | 10/2002 | Armstrong et al. ...... | 228/248.1 |
| 2003/0141041 A1 * | 7/2003 | Chen ......................... | 165/80.3 |
| 2003/0230398 A1 * | 12/2003 | Lee et al. .............. | 165/104.21 |
| 2005/0098304 A1 * | 5/2005 | Lin et al. ............... | 165/104.33 |
| 2005/0257920 A1 * | 11/2005 | Sheng et al. ........... | 165/104.33 |

FOREIGN PATENT DOCUMENTS

JP 11097596 A * 4/1999

* cited by examiner

*Primary Examiner*—Allen J. Flanigan
(74) *Attorney, Agent, or Firm*—Birch, Stewart, Kolasch, & Birch, LLP.

(57) ABSTRACT

A method for manufacturing a radiating module consisting of a plurality of radiating fins, at least one heat-transfer tube, and a seat includes the steps of forming through holes on the radiating fins, extending the heat-transfer tube through the through holes on the radiating fins, and positioning a seat in an open-bottomed recess formed at a lower surface of the radiating fins to connect to the heat-transfer tube. The seat is made of the same material as the heat-transfer tube, so that heat energy can be quickly transferred from the seat to the heat-transfer tube and radiated from the radiating fins without the need of contacting of the seat with the radiating fins.

11 Claims, 11 Drawing Sheets

RADIATING MODULE AND THE MANUFACTURING METHOD THEREOF

This Nonprovisional application claims priority under 35 U.S.C. § 119(a) on patent application No. 092135628 filed in TAIWAN on Dec. 16, 2003, the entire contents of which are hereby incorporated by reference.

FIELD OF THE INVENTION

The present invention relates to a radiating module, and more particularly to a radiating module having a seat directly connected to heat-transfer tubes without the need of contacting with radiating fins. The present invention also relates to a method of manufacturing this type of radiating module.

BACKGROUND OF THE INVENTION

A heat-transfer tube is generally an elongated hollow metal tube having two sealed ends. Theoretically speaking, the heat-transfer tube may have any exterior configuration. A layer of wicks is attached to an inner wall surface of the heat-transfer tube, and soaked in a working medium for the heat-transfer tube. The structure of the heat-transfer tube may vary with the amount and temperature of heat to be transferred via the heat-transfer tube.

Currently available heat-transfer tubes are made of different materials, including copper, nickel, stainless steel, tungsten, and other alloys. When the heat-transfer tube has an end positioned at a place having a higher temperature, and the other end at a place having a lower temperature, heat is transferred via the tube. Heat passes through the metal wall of the tube at the end located at the high-temperature place and into the layer of wicks, and the working medium in the wicks is heated and evaporated. Therefore, the end of the heat-transfer tube located at the high-temperature place is referred to as the "evaporator". The evaporated working medium gathers in the hollow tube of the evaporator, and flows toward the other end of the heat-transfer tube. Since the other end of the tube is in contact with a low-temperature place, it causes the evaporated working medium reaching there to condense. At this point, the heat carried by the evaporated working medium passes through the wicks, the working medium, and the metal tube wall into the low-temperature place. Therefore, the end of the heat-transfer tube located at the low-temperature place is referred to as the "condenser". The evaporated working medium condenses into liquid again at the condenser. The condensed working medium will then flow from the condenser back to the evaporator under a capillary pumping action. Through continuous circulating of the working medium between the evaporator and the condenser, heat is transferred from the high-temperature place to the low-temperature place. This forms the working principle of the heat-transfer tube.

The heat-transfer tube has many advantages due to its unique structure and working principle. Structurally speaking, it is a hollow tube and is therefore much lighter than a metal rod having the same volume. The heat-transfer tube has simple appearance to enable easy connection of it to other instruments. The heat-transfer tube has two sealed ends and does not need to add new working medium thereinto. It does not have any movable parts and is therefore not subjected to any wearing and is more durable for use. It does not produce any noise, either. According to the working principle thereof, the heat-transfer tube has high efficient heat-transfer ability due to the evaporation and condensation of the working medium inside the tube.

In addition, with the capillary pumping action, the fluid inside the heat-transfer tube may keep circulating without any external force even in a weight-loss condition in the space. Therefore, the heat-transfer tube is widely employed to use with radiators to effectively solve the problem of high amount of heat generated by electronic products that have very high operating speed.

FIGS. 1 and 2 shows a conventional radiating module. As shown, the conventional radiating module includes a plurality of radiating fins 11, a seat 12, and one or more U-shaped heat-transfer tubes 13. The radiating fins 11 are provided thereon with through holes 111. When the radiating fins 11 are successively and parallelly arranged, the U-shaped heat-transfer tubes 13 may be extended through the through holes 111 on the radiating fins 11 to connect to the latter. Paste tin is applied to a lower surface of the radiating fins 11 and a top surface of the seat 12, so as to connect the seat 12 to the heat-transfer tubes 13. The seat 12 has an area larger or equal to the lower surface formed from the radiating fins 11.

The above-structured conventional radiating module may be divided into two types. The first type of the conventional radiating module includes radiating fins 11 made of aluminum and a seat 12 made of copper. The radiating fins 11 must be nickel-plated before being welded to the seat 12. The second type of the conventional radiating module includes radiating fins 11 and seat 12 made of the same copper material, and can therefore be directly welded together.

Either of the two types of conventional radiating modules has problems in use. The radiating fins 11 and the seat 12 of the first type of radiating module are made of different materials and use paste tin to weld to each other. Since two materials having different heat conductivity are used, the radiating module has poor heat transfer efficiency. The use of a connecting medium, that is, the paste tin, to connect the seat to the heat-transfer tubes further adversely affects the radiating effect of the radiating module. Moreover, since the radiating fins 11 is made of aluminum and must be nickel-plated before being connected to the seat 12, the radiating module requires high manufacturing cost while has reduced rate of good yield. The second type of radiating module not only has reduced radiating effect due to the paste tin, but also overly high weight due to the copper-made large-area seat 12. Moreover, the copper-made radiating fins 11 makes the second type of radiating module 600–700 grams heavier than the first type of radiating module having aluminum radiating fins 11. The second type of radiating module is therefore too heavy to be accepted by consumers.

It is therefore tried by the inventor to develop a method of manufacturing an improved radiating module to eliminate the above-mentioned problems.

SUMMARY OF THE INVENTION

A primary object of the present invention is to provide a radiating module that has a seat directly connected to heat-transfer tubes without the need of contacting with radiating fins, and can therefore be manufactured in a simplified process at reduced cost and upgraded rate of good yield.

Another object of the present invention is to provide a radiating module that has a seat and at least one heat-transfer tube made of the same material, so that the seat and the heat-transfer tube may be directly connected to one another to provide enhanced heat conductivity.

A further object of the present invention is to provide a radiating module that has a seat with an area much smaller than a lower surface formed from a plurality of radiating fins, so that the radiating module has reduced overall weight and manufacturing cost.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 3:
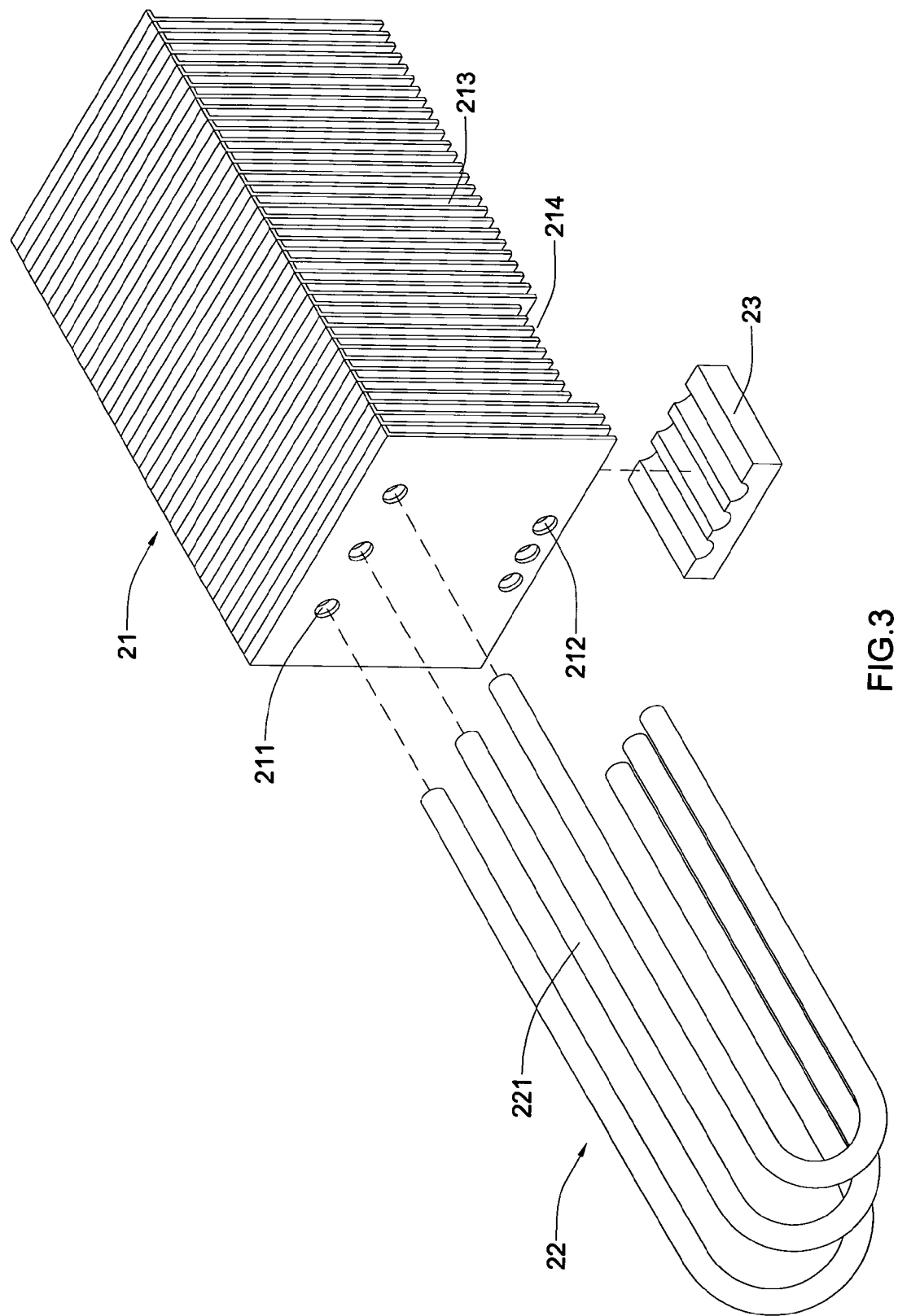
FIG. 3 is an exploded perspective view of a radiating module according to a first embodiment of the present invention.
Figure 4:
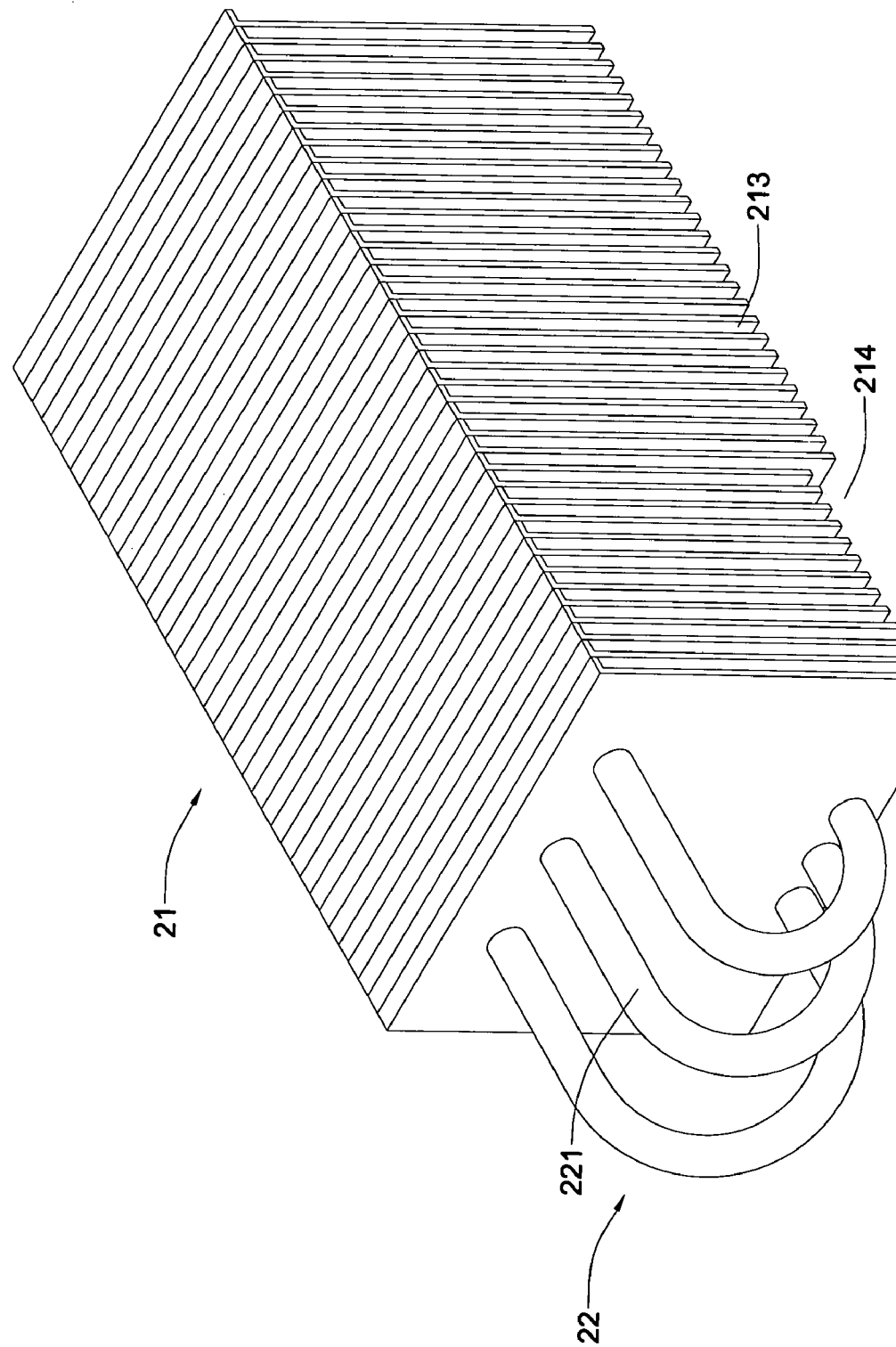
FIG. 4 is an assembled perspective view of FIG. 3.
Figure 5:
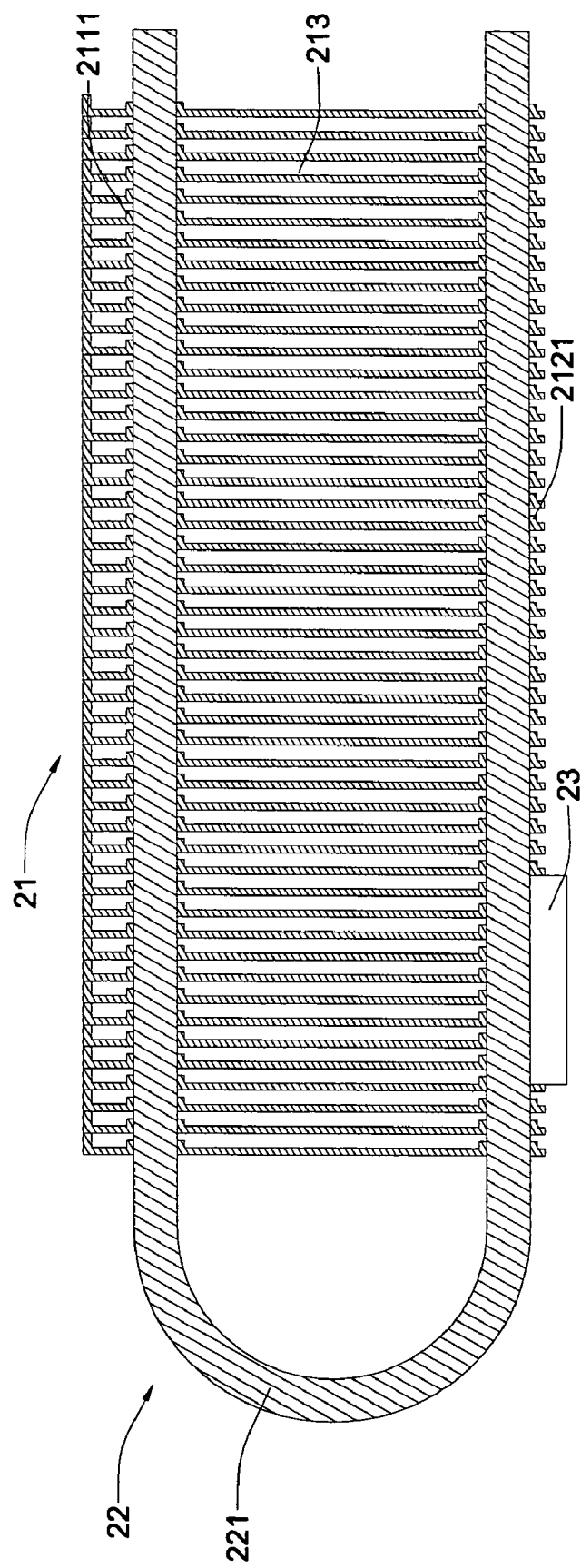
FIG. 5 is a sectioned side view of FIG. 4.

Please refer to FIGS. 3, 4, and 5 in which a radiating module according to a first embodiment of the present invention is shown. As shown, the first radiating module includes at least a plurality of successively and parallelly arranged radiating fins 21, a plurality of heat-transfer tubes 22, and a seat 23.

The radiating fins 21 are made of aluminum material and provided at predetermined positions with multiple rows of coaxial upper holes 211 and coaxial lower through holes 212. The radiating fins 21 are also provided at the same side around each upper and lower hole 211, 212 with an axially extended annular flange 2111, 2121, so that an air passage 213 having a width equal to an axial length of the annular flange 2111, 2121 is left between any two adjacent radiating fins 21 to allow good flowing of air therethrough. Each row of the coaxial upper and lower through holes 211, 212 on the successively and parallelly arranged radiating fins 21 forms a hollow path.

A recess 214 is formed at a lower surface formed from the successively and parallelly arranged radiating fins 21, so that sections of the rows of coaxial lower through holes 212 passing through the recess 214 are formed into several open-bottomed channels.

The heat-transfer tubes 22 are made of copper material and each has a U-turn portion 221, so that two ends of the U-shaped heat-transfer tube 22 may be extended into two paths formed by two corresponding rows of coaxial upper and lower through holes 211, 212 on the radiating fins 21 and thereby connects the radiating fins 21 to the heat-transfer tube 22. It is noted sections of the heat-transfer tubes 22 passing through the open-bottomed section of the lower through holes 212 has a lower portion exposed from the lower surface of the radiating fins 21.

The seat 23 is made of a material the same as that of the heat-transfer tubes 22, and has a flat bottom surface and a grooved top surface. The seat 23 is located in the recess 214 formed below the parallelly arranged radiating fins 21 with the grooved top surface in contact with the lower portion of the heat-transfer tubes 22 exposed from the open-bottomed section of the lower through holes 212. Material having excellent heat conductivity, such as paste tin, gold, or silver, is applied on the grooved top surface of the seat 23 to serve as a bonder to firmly bond the seat 23 to the heat-transfer tubes 22 at the recess 214. It is noted the seat 23 has an area much smaller than the whole lower surface formed from the successively and parallelly arranged radiating fins 21. Since the seat 23 and the heat-transfer tubes 22 are made of the same copper material, heat may be quickly transferred from the seat 23 to the heat-transfer tubes 22 and radiated from the radiating fins 21.

A method for manufacturing the above-structured radiating module includes the following steps:

a. To form coaxial upper through holes 211 and lower through holes 212 on a plurality of radiating fins 21, such that each of the through holes 211, 212 has an annular flange 2111, 2121 axially extended toward the same side of the radiating fins 21;

b. To successively and parallelly arrange the radiating fins 21, so that a space equal to an axial length of the annular flange 2111, 2121 is left between any two adjacent radiating fins 21 to serve as an air passage, and the coaxial upper and lower through holes 211, 212 form several rows of hollow paths on the radiating fins;

c. Extend two ends of a plurality of U-shaped heat-transfer tubes 22 into the hollow paths formed from the coaxial upper and lower through holes 211, 212, so that the radiating fins 21 are connected to the heat-transfer tubes 22; and d. Connect a seat 23, which is made of the same material as that of the heat-transfer tubes 22, to the heat-transfer tubes 22.

Figure 1:
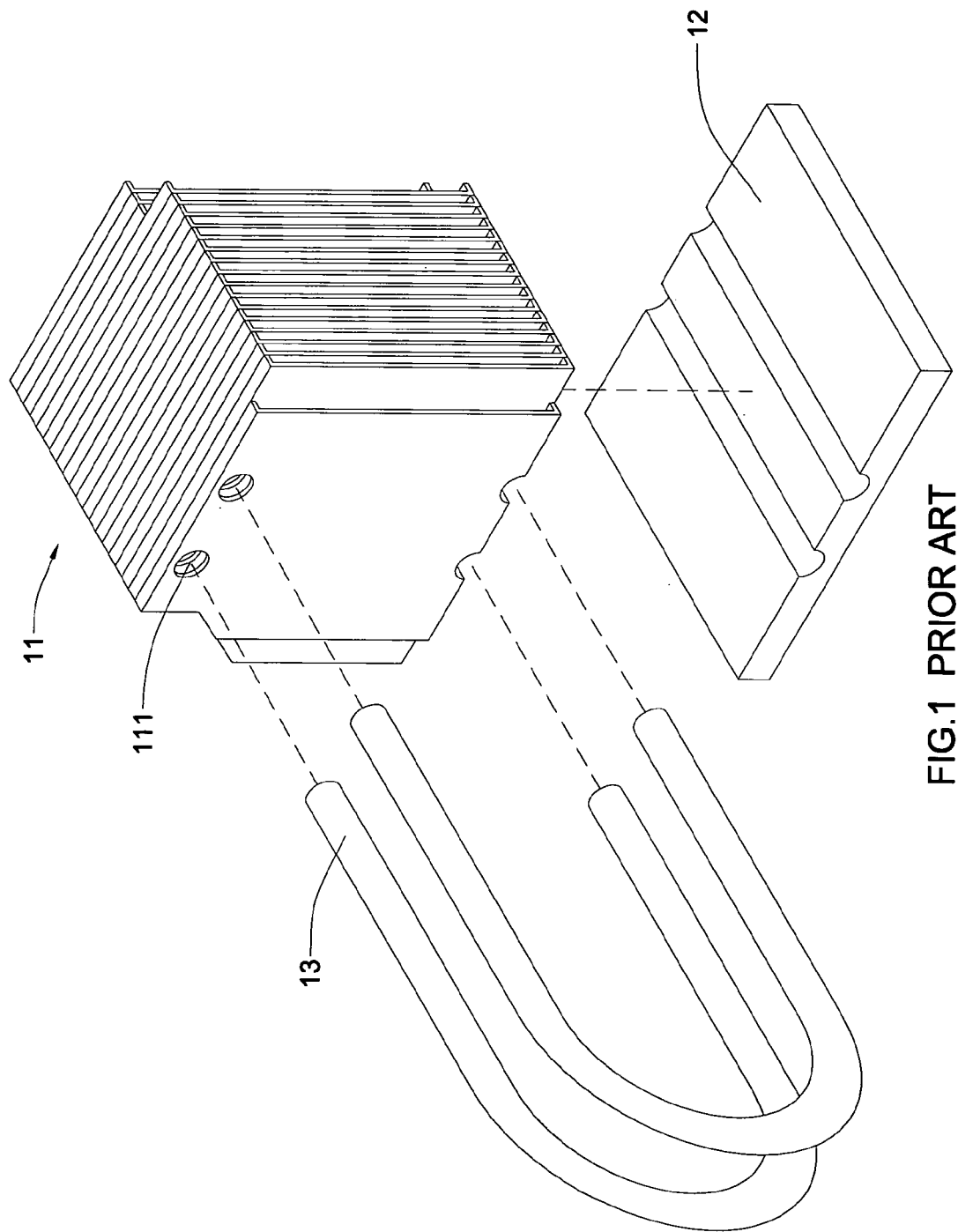
FIG. 1 is an exploded perspective view of a conventional radiating module.
Figure 2:
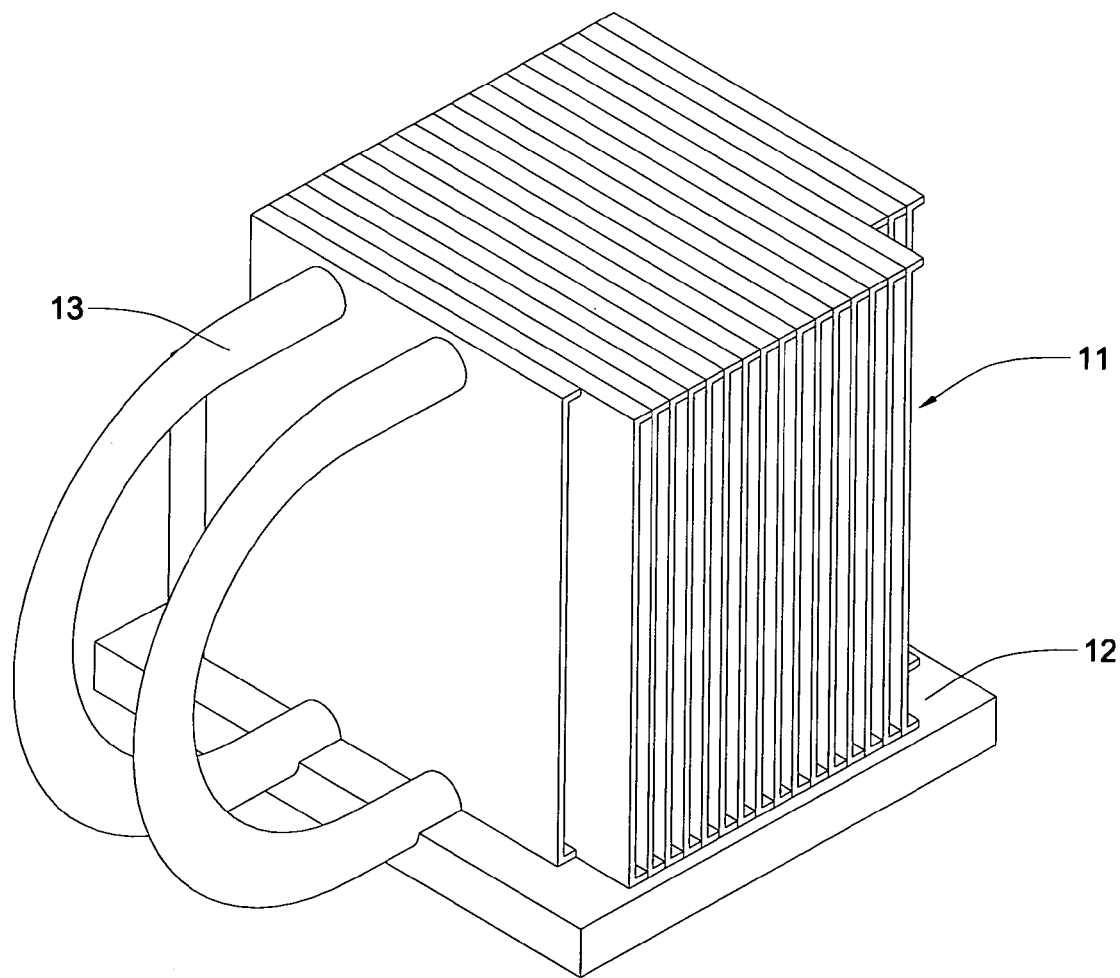
FIG. 2 is an assembled perspective view of FIG. 1.

Since the seat 23 is much smaller than the conventional seat 12, the radiating module of the present invention has an overall weight much lighter than the conventional radiating module shown in FIGS. 1 and 2. Moreover, the seat 23 is in direct contact with the heat-transfer tubes 22 without the need of connecting to the radiating fins 21. Therefore, the radiating fins 21 need not be nickel-plated in advance for connecting to the seat 23. The radiating module of the present invention may therefore be manufactured with simplified process at largely reduced cost and upgraded rate of good yield.

Figure 6:
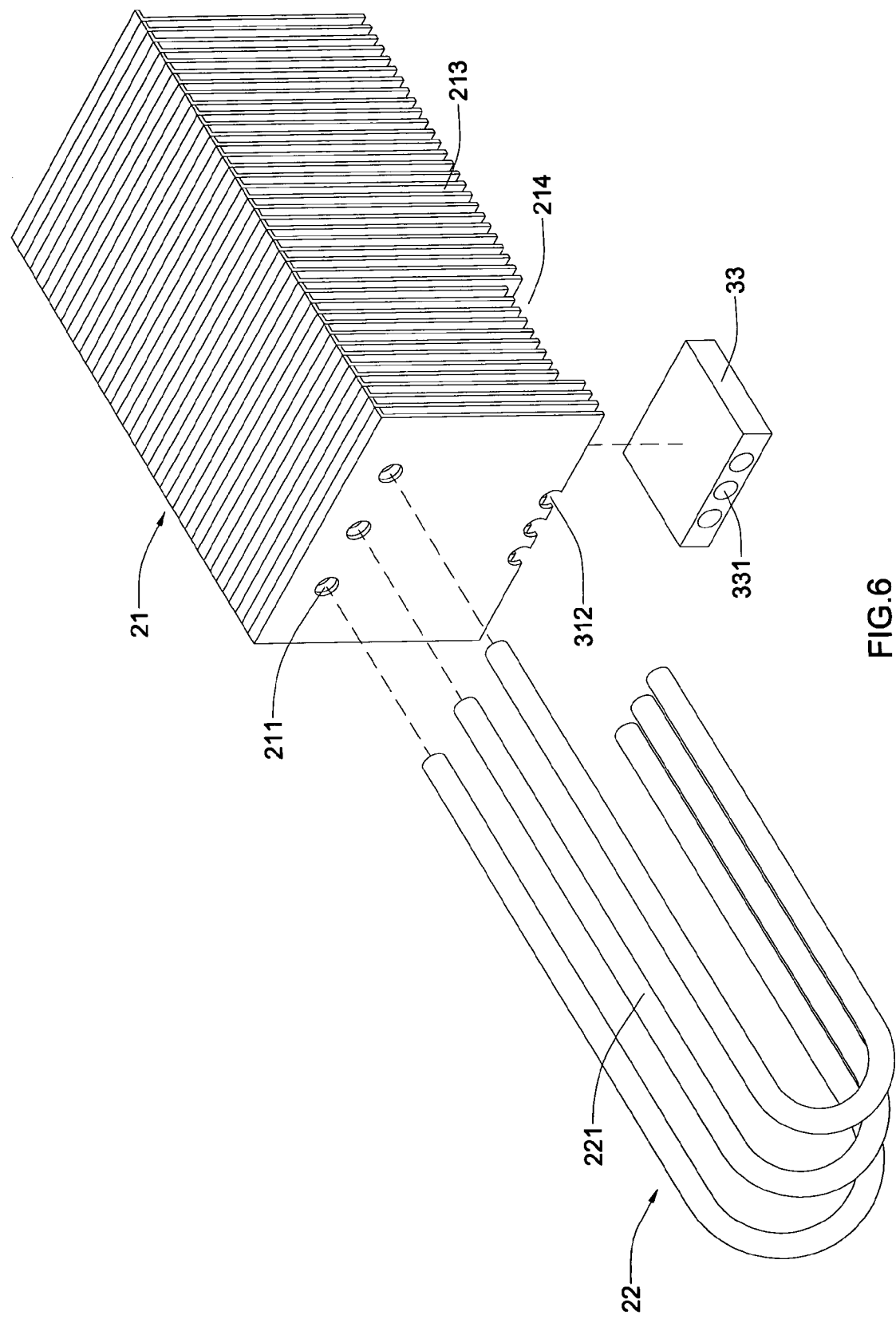
FIG. 6 is an exploded perspective view of a radiating module according to a second embodiment of the present invention.
Figure 7:
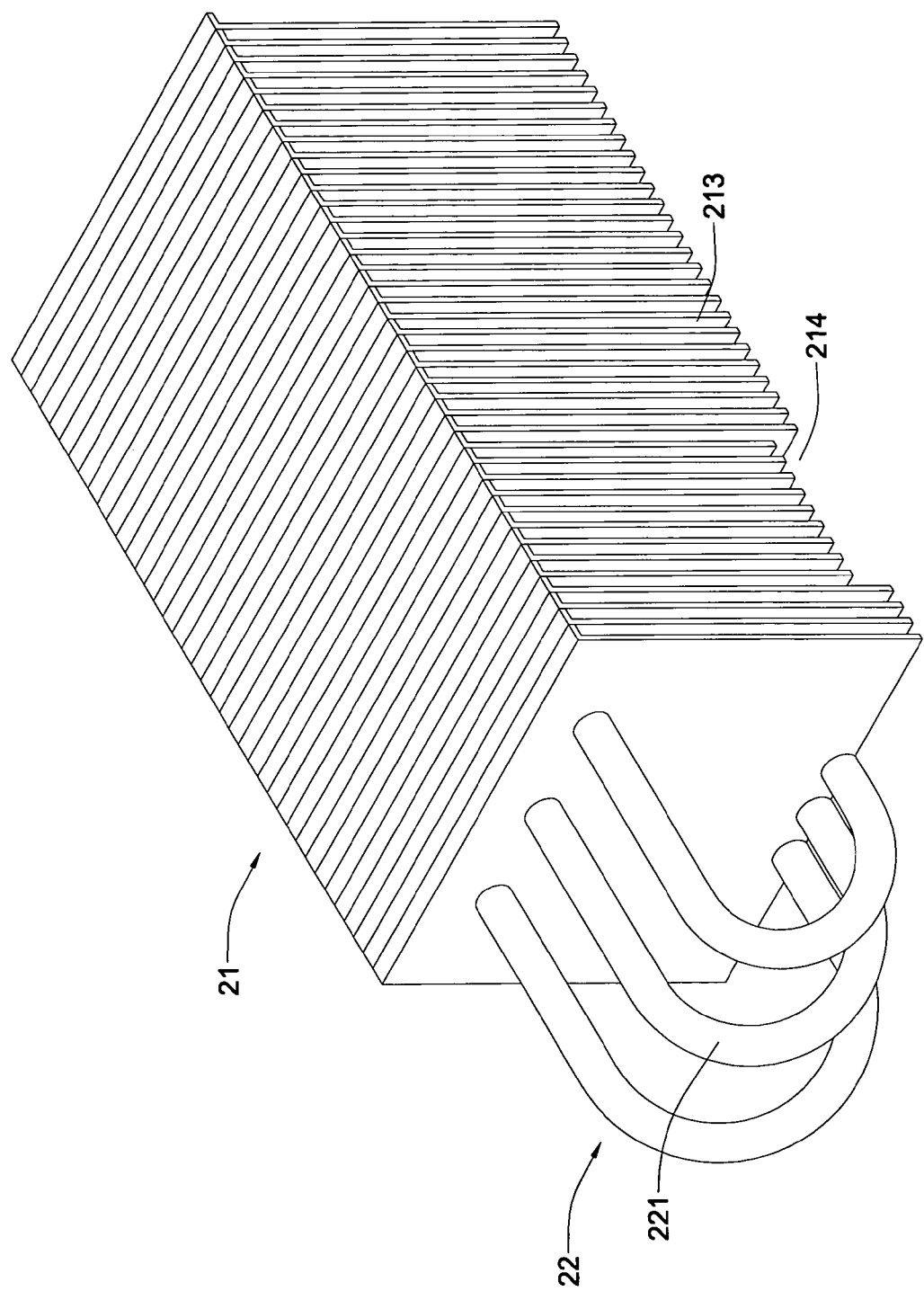
FIG. 7 is an assembled perspective view of FIG. 6.
Figure 8:
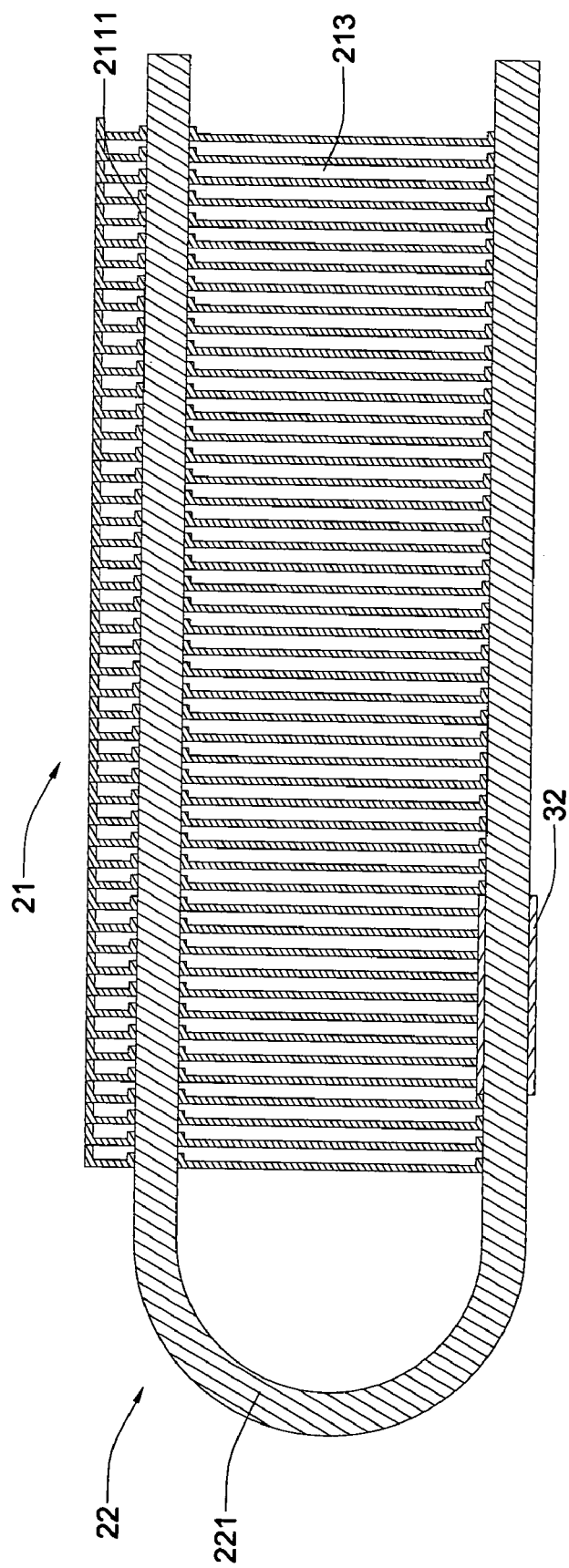
FIG. 8 is a sectioned side view of FIG. 7.

FIGS. 6, 7, and 8 shows a radiating module according to a second embodiment of the present invention. The radiating module of the second embodiment is structurally and functionally similar to the first embodiment, except that it has a seat 33 different from the seat 23. As shown, the seat 33 has flat top and bottom surfaces, and is provided with horizontally extended through holes 331 between the top and the bottom surface. Moreover, the radiating fins 21 in the second embodiment are not provided with the coaxial lower through holes 212. Instead, the radiating fins 21 in the second embodiment are provided at the lower surface with open-bottomed grooves 312, so that two ends of the heat-transfer tubes 22 are separately extended through the rows of coaxial upper through holes 211 and the open-bottomed grooves 312. Sections of the heat-transfer tubes 22 passing through the recess 214 also extended the through holes 331 on the seat 33 to connect the seat 33 to the heat-transfer tubes 22.

Figure 9:
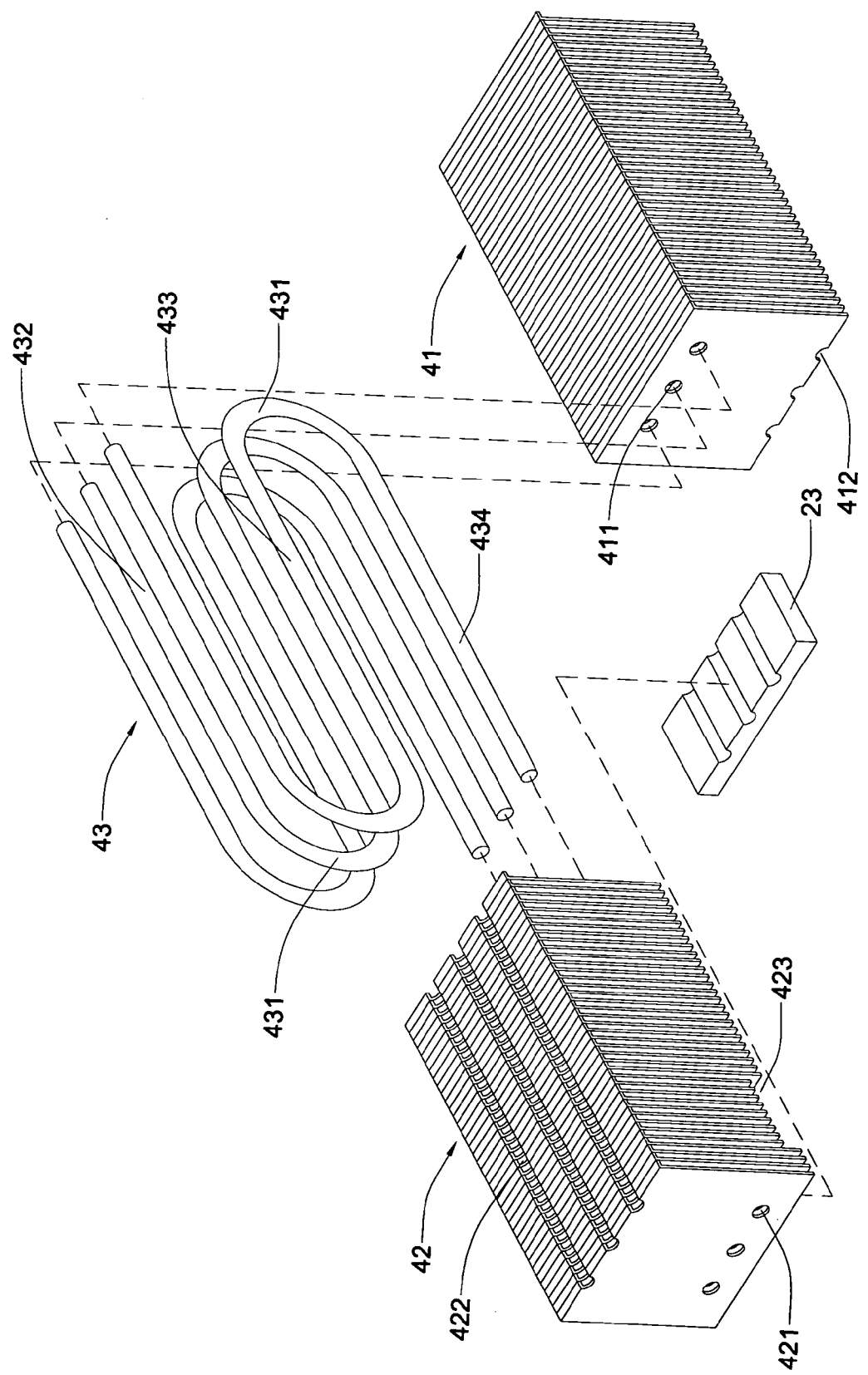
FIG. 9 is an exploded perspective view of a radiating module according to a third embodiment of the present invention.
Figure 10:
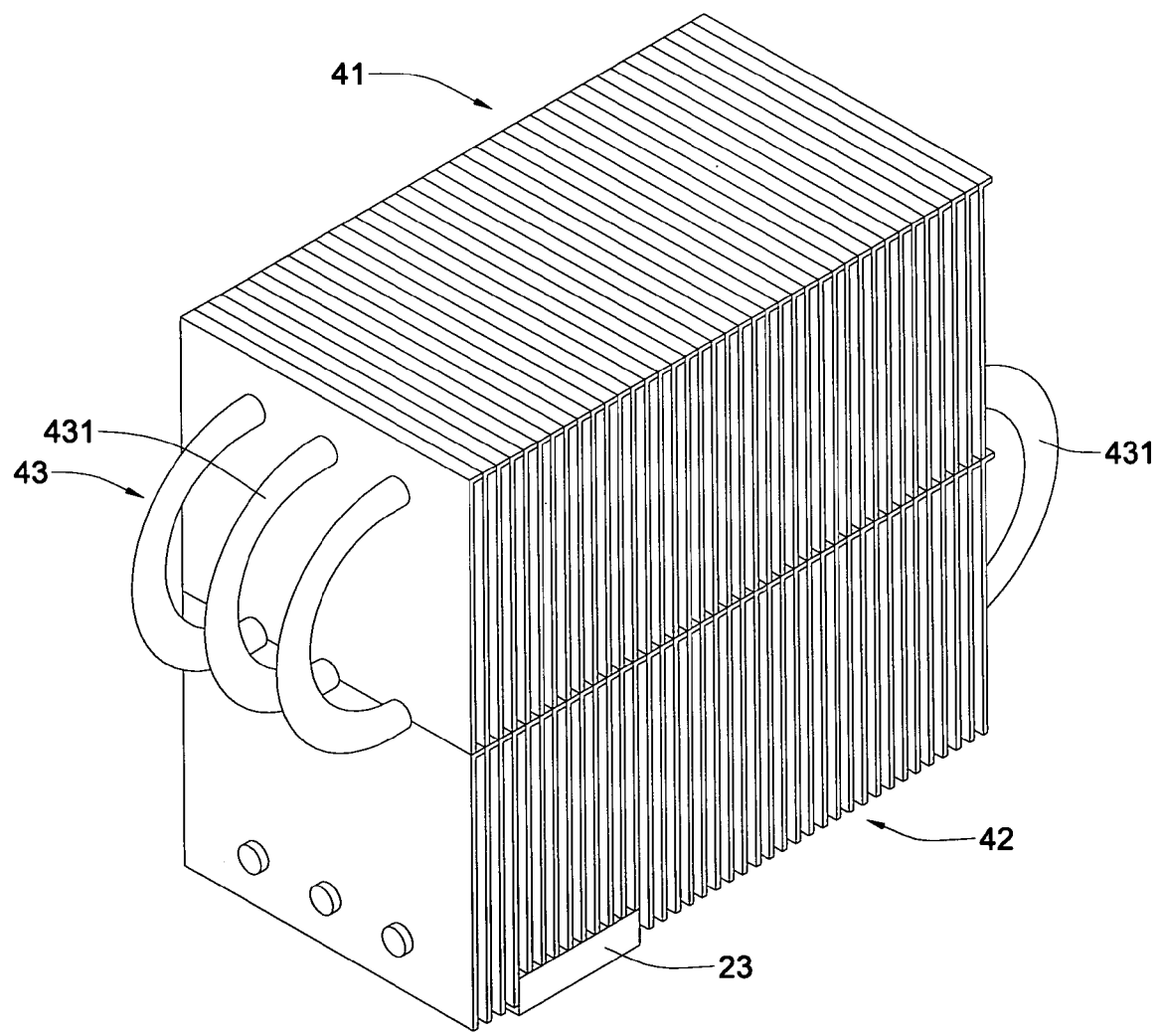
FIG. 10 is an assembled perspective view of FIG. 9.
Figure 11:
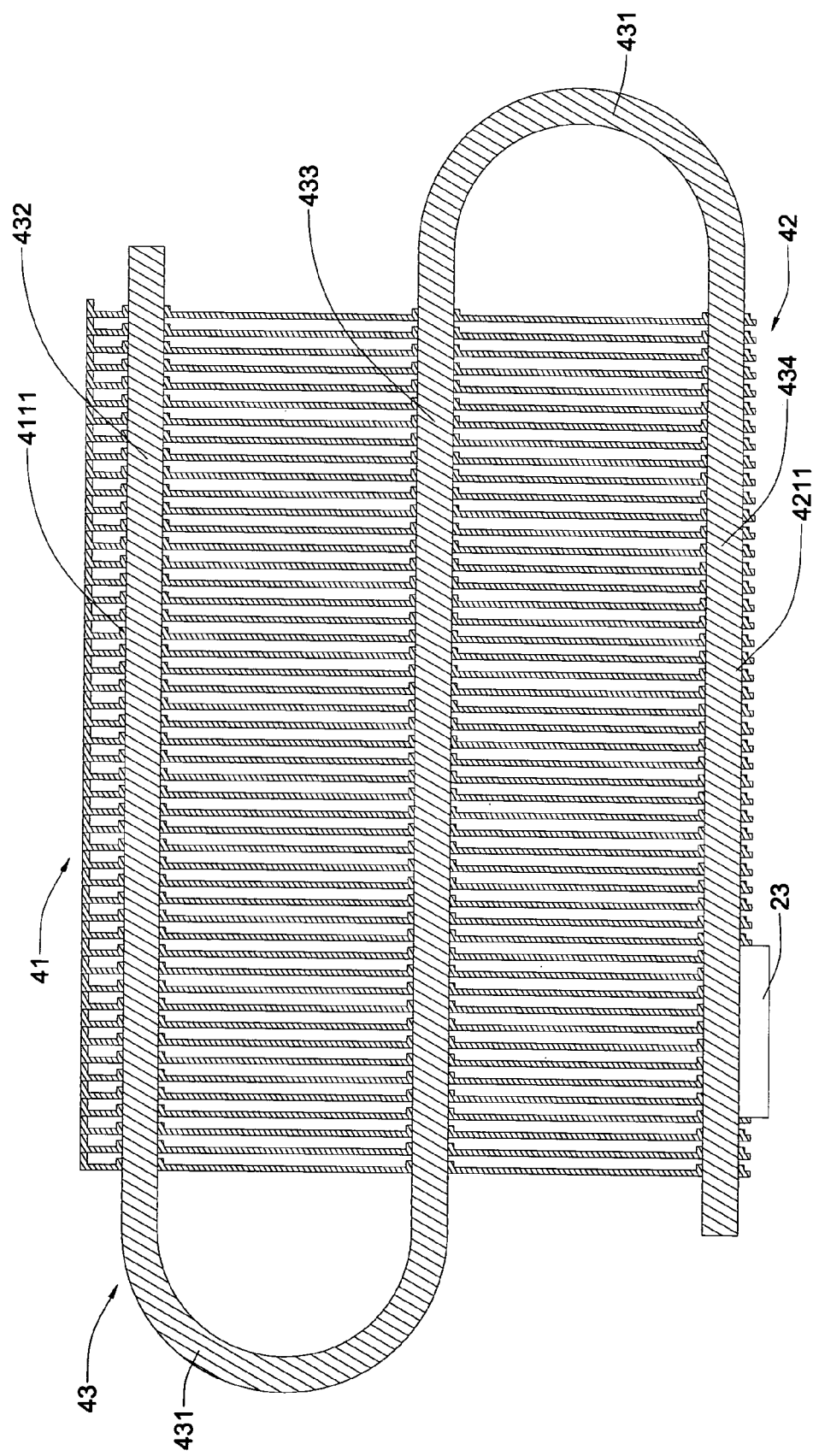
FIG. 11 is a sectioned side view of FIG. 10.

FIGS. 9, 10, and 11 shows a radiating module according to a third embodiment of the present invention. The radiating module of the third embodiment is structurally and functionally similar to the first embodiment, except that it includes S-shaped heat-transfer tubes 43, each of which has two U-turn portions 431 and accordingly, an upper, a middle, and a lower tube body 432, 433, 434; and two sets of radiating fins 41 and 42.

The first set of radiating fins 41 are provided at predetermined positions with several rows of upper through holes 411, and at a lower surface with several rows of open-bottomed grooves 412 corresponding to the upper through holes 411. The first set of radiating fins 41 are also provided at the same side around each upper through hole 411 with an axially extended annular flange 4111, so that an air passage having a width equal to an axial length of the annular flange 4111 is left between any two adjacent radiating fins 41 to allow good flowing of air therethrough.

The second set of radiating fins 42 are provided at predetermined positions with several rows of lower through holes 421, and at an upper surface with several rows of open-topped grooves 422 corresponding to the lower through holes 421. The second set of radiating fins 42 are also provided at the same side around each lower through hole 421 with an axially extended annular flange 4211, so that an air passage having a width equal to an axial length of the annular flange 4211 is left between any two adjacent radiating fins 42 to allow good flowing of air therethrough. An open-bottomed recess 423 is formed at a lower surface of the second set of radiating fins 42.

The upper tube bodies 432 of the heat-transfer tubes 43 are separately extended through the upper through holes 411 on the first radiating fins 41, so that the open-bottomed grooves 412 at the lower surface of the first radiating fins 41 are seated on an upper half of the middle tube bodies 433 of the heat-transfer tubes 43. Similarly, the lower tube bodies 434 of the heat-transfer tubes 43 are separately extended through the lower through holes 421 on the second radiating fins 42, so that the open-topped grooves 422 at the upper surface of the first radiating fins 42 are abutted on a lower half of the middle tube bodies 433 of the heat-transfer tubes 43. In this manner, the first and the second set of radiating fins 41, 42 are connected to the heat-transfer tubes 43.

It is noted the second set of radiating fins 42 have an open-bottomed recess 423 formed at a lower surface thereof, so that sections of the lower through holes 421 passing through the recess 423 are open-bottomed to expose a lower half of the lower tube bodies 434 of the heat-transfer tubes 43 at the recess 423. In this manner, the seat 23 may be located at the recess 423 to contact with and connect to the heat-transfer tubes 43.

The present invention has been described with some preferred embodiments thereof and it is understood that many changes and modifications in the described embodiments can be carried out without departing from the scope and the spirit of the invention that is to be limited only by the appended claims.

What is claimed is:

1. A method of manufacturing radiating module, comprising the steps of:
   a. forming coaxial upper through holes and lower through holes on a plurality of radiating fins, such tat each of said upper and lower through holes has an annular flange axially extended toward the same side of said radiating fins;
   b. successively and parallelly arranging said radiating fins, so that a space equal to an axial length of said annular flange is left between any two adjacent radiating fins to serve as an air passage, and said coaxial upper and lower through holes form several lows of hollow paths on said radiating fins;
   c. extending two ends of a plurality of U-shaped heat-transfer tubes into said hollow paths formed from said coaxial upper and lower through holes, so that said radiating fins are connected to said heat-transfer tubes; and
   d. connecting a scat to said heat-transfer tubes, so that said seat is in contact with a bottom surface of said radiating fins.

2. The method of manufacturing radiating module as claimed in claim 1, wherein said step (d) further includes the step of applying a bonder on a surface of said seat in contact with said heat-transfer tubes, so as to bond said seat to said heat-transfer tubes.

3. The method of manufacturing radiating module as claimed in claim 2, wherein said bonder is selected from the group consisting of paste tin, gold, and silver.

4. The method of manufacturing radiating module as claimed in claim 1, wherein said radiating fins are made of aluminum material, and said seat and said heat-transfer tithes are made of copper material.

5. A radiating module, comprising:
   a plurality of radiating fins having through holes formed at predetermined positions thereon;
   at least one heat-transfer tube extended through said through holes formed on said radiating fins; and
   a seat connected to said at least one heat-transfer tube and in contact with a lower surface of said radiating fins, the seat has an area smaller than an area of the lower surface of the radiating fins;
   whereby heat energy may be quickly transferred from said seat to said at least one heat-transfer tube and then radiated from said radiating fins.

6. The radiating module as claimed in claim 5, wherein said radiating fins are made of aluminum material, and said at least one heat-transfer tube and said seat are made of copper material.

7. The radiating module as claimed in claim 5, wherein said lower surface of said radiating fins is provided with an open-bottomed recess, into which said seat is set.

8. The radiating module as claimed in claim 5, wherein said at least one heat-transfer tube has at least one U-turn provided at a predetermined position on said heat-transfer tube.

9. The radiating module as claimed in claim 5, wherein there are two or more said heat-transfer tubes included in said radiating module.

10. The radiating module as claimed in claim 5, wherein said seat and said at least one heat-transfer tube are connected to one another via bonder.

11. The radiating module as claimed in claim 10, wherein said bonder is selected from the group consisting of paste tin, gold, and silver.

* * * * *